(12) United States Patent
Fritzinger et al.

(10) Patent No.: US 6,218,255 B1
(45) Date of Patent: Apr. 17, 2001

(54) METHOD OF MAKING A CAPACITOR

(75) Inventors: Larry Bruce Fritzinger; Nace Layadi; Sailesh Mansinh Merchant; Pradip Kumar Roy, all of Orlando, FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/277,778

(22) Filed: Mar. 29, 1999

Related U.S. Application Data

(60) Provisional application No. 60/115,762, filed on Jan. 13, 1999.

(51) Int. Cl.$^7$ ............................................. H01L 21/20
(52) U.S. Cl. ..................... 438/386; 438/387; 257/303
(58) Field of Search ................................. 438/386, 387, 438/685, 688, 257, 397; 257/303, 306

(56) References Cited

U.S. PATENT DOCUMENTS

| | | | |
|---|---|---|---|
| 5,049,956 | * 9/1991 | Yoshida et al. | 257/317 |
| 5,192,703 | * 3/1993 | Lee et al. | 438/396 |
| 5,693,561 | * 12/1997 | Merchant et al. | 438/643 |
| 5,973,351 | * 10/1999 | Kotecki et al. | 257/310 |
| 5,998,261 | * 12/1999 | Hofmann et al. | 438/257 |

\* cited by examiner

*Primary Examiner*—Richard Elms
*Assistant Examiner*—Christian D. Wilson
(74) *Attorney, Agent, or Firm*—Anthony Grillo

(57) ABSTRACT

The present invention provides a method for fabricating a capacitor, comprising the steps of forming a trench in a substrate, forming a layer of a first material selected from the group consisting of titanium and titanium nitride in the trench, filling the trench with a conductive material to form a conductive plug, planarizing the substrate, patterning the substrate to partially expose the first material and to create a top portion and a bottom portion to the plug, wherein the bottom portion is in the substrate, and removing the first material from the top portion of the plug.

20 Claims, 3 Drawing Sheets

METHOD OF MAKING A CAPACITOR

This application claims priority from provisional application Ser. No. 60/115,762, filed on Jan. 13, 1999.

FIELD OF THE INVENTION

The present invention is directed, in general, to integrated circuits and, more specifically, to an integrated circuit that includes a capacitor.

BACKGROUND OF THE INVENTION

Integrated circuits in general, and CMOS devices in particular, have continued to gain wide spread usage as user demands for increased functionality and enhanced benefits continue to increase. In order to meet this demand, the integrated circuit industry continues to decrease the feature size of circuit structures in order to place more circuits in the same size integrated circuit area thereby continuously increasing the packing density for a given chip size. Over the last several years, structures have evolved from 1.2 micron gate areas (1 Mbit capacity) in the past, down to gate structure areas of 0.25 microns (1 Gbit capacity) and are expected to become even smaller in the near future.

For example, the ever-increasing demand for computer memory to facilitate calculations and data storage has fostered intense development efforts in the area of Dynamic Random Access Memory (DRAM), and especially embedded DRAM. The DRAM is generally a collection of transistor devices with each having an integrated circuit capacitor typically connected to its source electrode thereby forming a memory cell. This collection of memory cells is then arranged into a memory structure using a word line and a bit line to address each memory cell. This integrated capacitor may store an electrical charge to represent a binary "1" or store no electrical charge for a binary "0" as instructed by the word and bit control lines. Construction of these memory capacitors consists of using typically a tungsten (W) plug electrode structure for 0.25 micron technology connected to the source of the transistor, which then supports a dielectric material, such as tantalum pentoxide ($Ta_2O_5$), and then a top electrode, in sequence. There are many other uses for these capacitors in integrated circuits.

As the size technology of CMOS devices continues to shrink, the structure for a given memory size or circuit capability also shrinks as noted above. For example, the bond pads, which allow the integrated circuit to connect to external circuitry, cannot continue to shrink indefinitely. Currently, an integrated circuit package may have about 200 bond pads that are 50 microns by 50 microns in size. Shrinking topology coupled with this bond pad lower size limitation results in an excess of empty space around the bond pads. This allows for the inclusion of additional embedded memory around the bond pads. The use of higher dielectric constant oxides such as tantalum pentoxide as substitutes for silicon dioxide have allowed smaller structures still.

In an attempt to add the above-mentioned memory in certain conventional CMOS technologies, some manufacturers have partially etched back the material surrounding the plug to allow access to a portion of the area of the sidewalls in order to use the sidewalls of the plug to add to the capacitance per unit area. The capacitor dielectric then covers both the top of the plug, which is usually bare tungsten, and the sidewalls of the plug, which are usually titanium nitride (TiN). However, it has been observed that when this is done in conjunction with tantalum pentoxide being used as the dielectric, undesirable leakage current increases not in proportion to the area of the plug (a factor of two or three), but by two or three orders of magnitude. Accordingly, what is needed is a reduced feature size capacitor which overcomes the leakage current problems and other problems of the prior art.

SUMMARY OF THE INVENTION

The present invention provides for use with an integrated circuit a method for fabricating a capacitor, comprising the steps of forming a trench in a substrate, forming a layer of a first material selected from the group consisting of titanium and titanium nitride in the trench, filling the trench with a conductive material to form a conductive plug, planarizing the substrate, patterning the substrate to partially expose the first material and to create a top portion and a bottom portion to the plug, wherein the bottom portion is in the substrate, and removing the first material from the top portion of the plug.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity.

DETAILED DESCRIPTION

Figure 1:
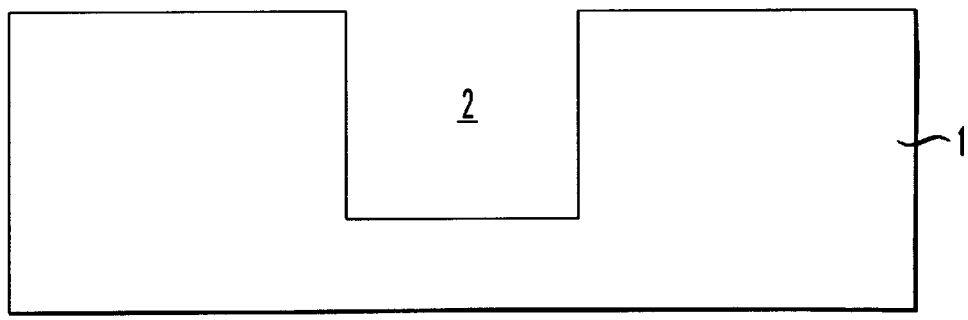
FIGS. 1–8 show a cross-sectional view of an integrated circuit during various steps in accordance with an embodiment of the invention.
Figure 2:
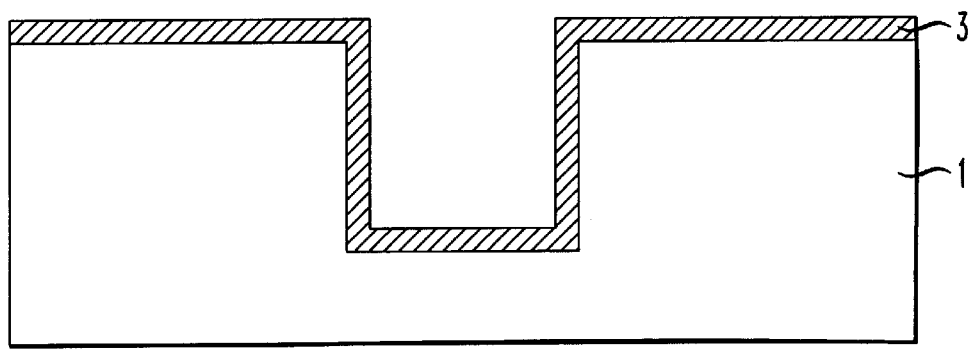
Figure 3:
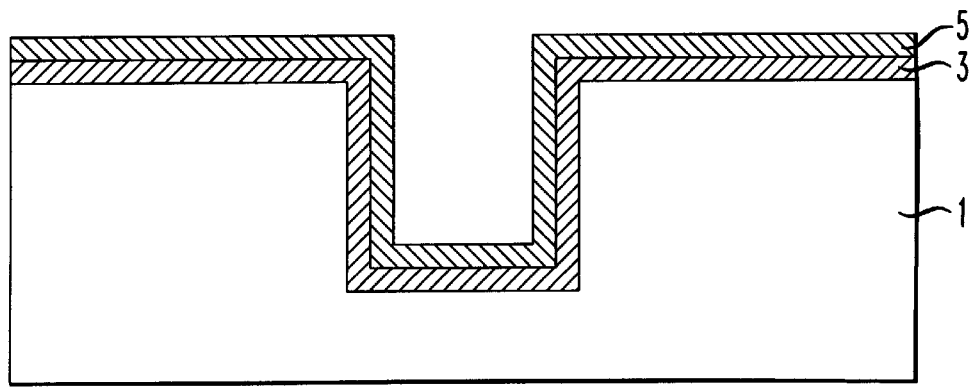
Figure 4:
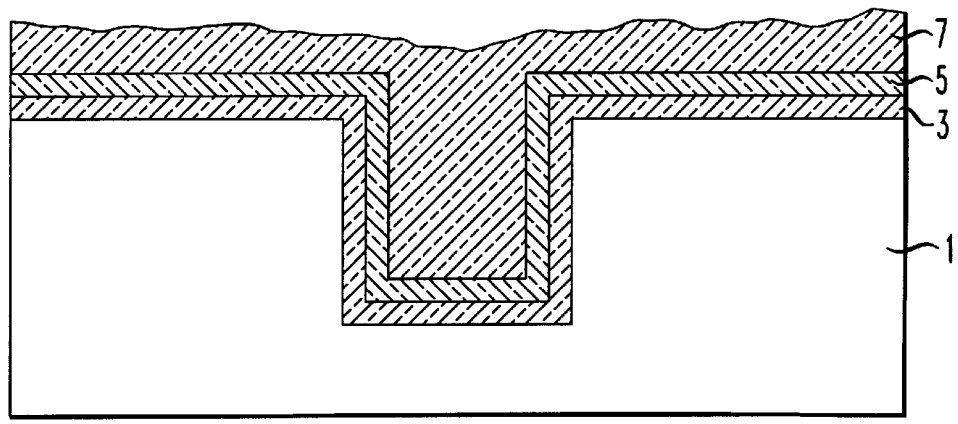
Figure 5:
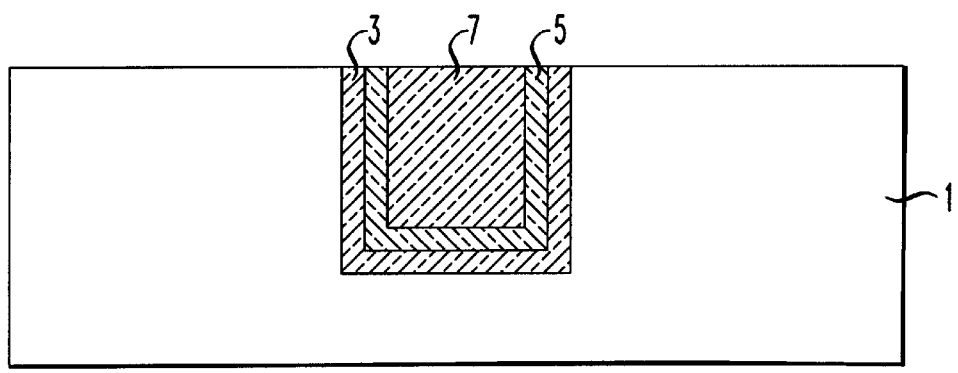
Figure 6:
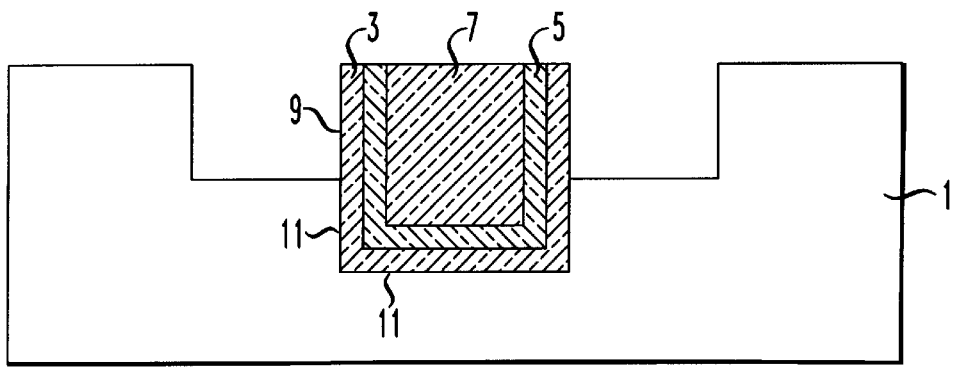
Figure 7:
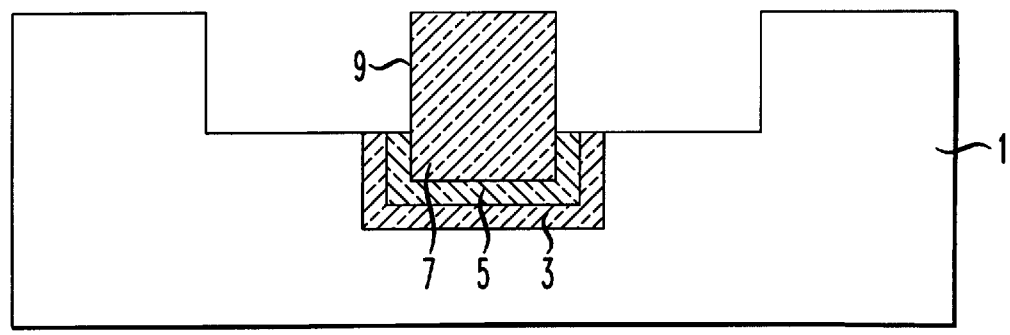
Figure 8:
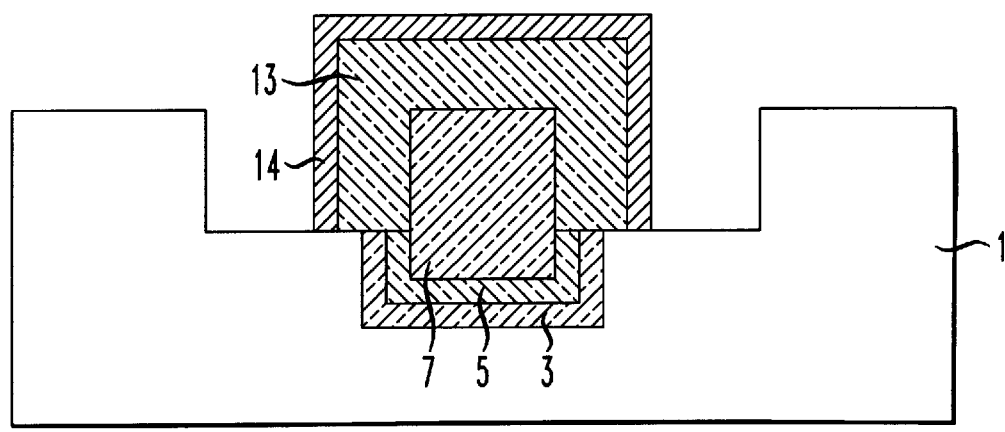

Referring initially to FIG. 1, illustrated is a substrate 1 having a trench 2 formed therein. FIG. 2 shows a titanium layer 3 formed in the trench and over the substrate, while FIG. 3 shows a titanium nitride layer 5, optional but preferred, being formed over the titanium layer 3. FIG. 4 shows the forming of an electrical conductor 7 like tungsten in the trench 2. The surface of the substrate 1 is shown after planarizing in FIG. 5. Note that the conductor 7 is now in the form of a plug having titanium nitride 3 sidewalls. FIG. 6 shows that after patterning of the substrate, usually by photolithographic means (photoresist, mask and etch), the titanium nitride 5 sidewalls of the conductive 7 plug are now exposed to form a top portion of the plug 9, which includes not only the top surface of the plug 7, but also part of the sidewalls of the plug, while a bottom portion 11 is anchored in the substrate 1. If a conventional MOM capacitor were to be made, processing would continue at this point with the deposition of a dielectric like tantalum pentoxide and a second electrode. Instead, FIG. 7 shows that titanium 3 and titanium nitride 5 are removed from the top portion 9 of the plug. FIG. 8 shows the addition of a dielectric layer 13 like tantalum pentoxide covered in turn by an electrode 14. In this way titanium nitride 5 contact with any tantalum pentoxide 13 is minimized to reduce leakage current. Note that the titanium nitride layer 5 has minimal contact with the tantalum pentoxide layer 13, but the structure has the desirable surface area increase, resulting from the patterning of the substrate, that allows an increase in capacitance per unit area.

It is not completely understood why tantalum pentoxide in contact with titanium nitride, as opposed to bare tungsten, has such a high leakage current. It is believed that titanium nitride reacts with tantalum pentoxide to form titanium suboxides, which are resistive. Alternatively, or in addition, the use of titanium nitride in conjunction with tantalum pentoxide and an underlying Ti layer getters the oxygen from the tantalum pentoxide via diffusion through the barrier, thus reducing the tantalum pentoxide to elemental Ta, creating electrical leakage paths or shorts. This results in general circuit performance degradation or failure.

The substrate will generally be a semiconductor such as silicon, covered by a dielectric such as silicon dioxide. In a typical embedded DRAM application the conductive plug 7 will be surrounded by dielectric and the bottom of the conductive plug 7 will contact the top of a transistor structure (not shown) in silicon.

Formation of the trench 2 is by conventional patterning such as by photoresist, masking and etching. A "trench" is generally a feature that does not extend all the way through a substrate, but a "trench" is not necessarily elongated and a trench may be round. However as used herein "trench", for simplicity, also encompasses a "via", which provides electrical communication between two layers, but a via need not be round. In the context of this invention, a trench can extend partially or fully through the substrate to form a via.

Formation of the titanium layer 3 and the titanium nitride layer 5 may be done by conventional physical vapor deposition (PVD) or chemical vapor deposition (CVD).

The conductive material 7 used to form the plug is preferably tungsten, but alternative materials include aluminum, aluminum alloys such as aluminum copper and aluminum silicon copper, doped polysilicon and the like and these may be deposited by conventional PVD, CVD, electroless and electrolytic plating and the like. Note that when the conductive plug 7 is W, the layer 5 on the W will be TiN and over the TiN will be an optional but preferred Ti layer 3. However, when the conductive plug is aluminum, the adhesion and barrier layers will usually be Ti/TiN/Ti or Ti of sufficient thickness.

In an advantageous embodiment, the plug 7 is W and the Ti layer 3 and TiN layer 5 are removed by reactive ion etching (plasma etching). TiN and Ti can be etched with a chlorine ($Cl_2$) or $Cl_2$/hydrogen bromide (HBr) mixture, these chemistries being selective to a W underlayer. Note that W is conventionally etched with sulfur hexafluoride ($SF_6$) or a mixture of $SF_6$ and nitrogen ($N_2$) or $SF_6$ and argon (Ar). While not completely understood, and not wishing to be held to any theory, W has a more volatile fluoride while Ti has a more volatile chloride. This is why fluorinated rather than chlorinated chemistries are usually used to etch W, and fluorinated chemistries are not preferred in the present invention for removing Ti and TiN in the presence of W. Preferred process parameters for etching of TiN and Ti from W in a reactive ion etcher are: an Ar flow rate of about 90 sccm, a $Cl_2$ flow rate of about 20 sccm, a pressure of about 45 milliTorr and an electrode power of about 450 W. Those skilled in the art will realize that the process parameters given above are equipment specific, in this case for etching W in a MXB reactive ion etcher made by Applied Materials of Santa Clara, Calif., and will vary from one manufacturer's equipment to another. The MB bottom electrode operates at 13.56 MHz and rotating magnets are used to improve uniformity and etch rate.

In another advantageous embodiment, the plug 7 is Al and the Ti layer 3 and TiN layer 5 are removed by reactive ion etching (plasma etching). Al etches very fast in $Cl_2$ chemistry, so fluorine containing gases are preferred. While not completely understood, and not wishing to be held to any theory, fluorine containing gases are believed to passivate aluminum. When etching TiN and Ti on Al, a carbon tetrafluoride ($CF_4$)/Ar mixture at low power and relatively high pressure is used. The process is selective to Al. Preferred process parameters for etching of TiN and Ti from Al in a reactive ion etcher are: an Ar flow rate of about 300 sccm, a $CF_4$ flow rate of about 50 sccm, a pressure of about 60 milliTorr and an electrode power of about 500 W. Those skilled in the art will realize that the process parameters given above are equipment specific, in the case of etching Al, to a TEL reactive ion etcher made by Tokyo Electronics of Tokyo, Japan, and will vary from one manufacturer's equipment to another. The TEL electrode operates at 13.56 MHz and rotating magnets are used to improve uniformity and etch rate.

The dielectric layer 13 may be made of a titanium or titanium nitride reactive dielectric including tantalum pentoxide. "Reactive" means allowing the dielectric to be reduced. Particularly preferred is the use of a stacked tantalum pentoxide dielectric system wherein silicon dioxide is first formed on silicon, followed by tantalum pentoxide, followed by another layer of silicon dioxide. Respective thicknesses are about 10 to about 2 nm, about 5 to about 30 nm and about 10 to about 120 nm. Stacked tantalum pentoxide systems are described by P. K. Roy et al. in Appl. Phys. Letts., Vol. 72, No. 22, Jun. 1, 1998, pp. 2835–37, incorporated herein by reference as if set forth in full.

Final capacitors would comprise $Ta_2O_5$, as dielectric layer 13 or other titanium nitride reactive or reducible dielectric and Al, W, doped polysilicon or other electrical conductor as a top electrode 14, which is used to make electrical connection to the rest of the embedded DRAM circuit and as a second electrode.

One application for such a capacitor electrode is in memory, optionally embedded, having a transistor in contact with an interconnect plug 7 formed within a dielectric layer overlaying the transistor. In one embodiment, the memory comprises a capacitor located on the dielectric layer that contacts the interconnect. In this particular embodiment, the capacitor includes a capacitor electrode located on the interconnect, wherein the electrode comprises a conductive plug having titanium nitride on its sidewalls that has been removed from the top portion of the plug.

It is readily apparent that the present invention provides for use with an integrated circuit, an embedded memory having a transistor (not shown) in contact with an interconnect conductive plug formed within a dielectric layer overlaying the transistor. The embedded memory comprises a capacitor of the present invention: an interconnect plug only coated on the bottom with titanium or titanium nitride, a dielectric and a top electrode located on the dielectric layer, the interconnect plug also providing connection with a transistor.

One embodiment of the invention is directed to a method for fabricating a capacitor, comprising the steps of: forming a trench in a substrate; forming a layer of a first material selected from the group consisting of titanium and titanium nitride in the trench; filling the trench with a conductive material to form a conductive plug; planarizing the substrate; and patterning the substrate to partially expose the first material and to create a top portion and a bottom portion to the plug, wherein the bottom portion is in the substrate; and removing the first material from the top portion of the plug.

The foregoing has disclosed preferred and alternative features and embodiments of the present invention so that one of ordinary skill in the art may better understand the detailed description of the invention that follows. Additional features of the invention will be described hereinafter that form the subject of the claims of the invention. One of ordinary skill in the art having the benefit of the present disclosure can appreciate that he can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method for fabricating a capacitor, comprising the steps of:

forming a trench in a substrate;

forming a layer of a first material selected from the group consisting of titanium and titanium nitride in the trench;

filling the trench with a conductive material to form a conductive plug;

planarizing the substrate;

patterning the substrate to partially expose the first material and to create a top portion and a bottom portion to the plug, wherein the bottom portion is in the substrate; and removing the first material from the top portion of the plug.

2. The method as recited in claim 1, wherein the substrate is selected from the group consisting of silicon and silicon dioxide.

3. The method as recited in claim 1, wherein the conductive material is selected from the group consisting of tungsten, aluminum and aluminum alloys.

4. The method as recited in claim 1, further comprising the step of forming a capacitor dielectric over the first material, wherein the capacitor dielectric is reactive with titanium nitride or titanium.

5. The method as recited in claim 1, further comprising the step of forming a tantalum pentoxide capacitor dielectric over the first material.

6. The method as recited in claim 1, wherein the first material is removed by plasma etching with a fluorine containing gas when the conductive plug is aluminum or aluminum alloy.

7. The method as recited in claim 6, wherein the fluorine containing gas is carbon tetrafluoride.

8. The method as recited in claim 6, wherein the fluorine containing gas further comprises argon.

9. The method as recited in claim 6, wherein the plasma etching is performed at a pressure of about 60 milliTorr.

10. The method as recited in claim 1, wherein the first material is removed by plasma etching with a gas selected from the group consisting of chlorine containing gas and bromine containing gas and mixtures thereof when the conductive plug is tungsten.

11. The method as recited in claim 10, wherein the chlorine containing gas is chlorine.

12. The method as recited in claim 10, wherein the bromine containing gas is hydrogen bromide.

13. The method as recited in claim 10, wherein the plasma etching gas further comprises argon.

14. The method as recited in claim 10, wherein the plasma etching is performed at a pressure of about 45 milliTorr.

15. A capacitor produced by the method of claim 1.

16. A circuit comprising the capacitor produced by the method of claim 1.

17. An embedded dynamic random access memory circuit comprising the capacitor produced by the method of claim 1.

18. A capacitor fabricated by the method of claim 1, comprising a layer of capacitor dielectric that is reactive with titanium nitride or titanium, and a second electrode.

19. A method for fabricating a capacitor, comprising the steps of:

forming a trench in a substrate;

forming a layer of a first material selected from the group consisting of titanium and titanium nitride in the trench;

filling the trench with tungsten to form a conductive plug;

planarizing the substrate;

patterning the substrate to partially expose the first material and to create a top portion and a bottom portion to the plug, wherein the bottom portion is in the substrate; and removing the first material from the top portion of the plug by plasma etching with a gas selected from the group consisting of chlorine containing gas and bromine containing gas and mixtures thereof.

20. A method for fabricating a capacitor, comprising the steps of:

forming a trench in a substrate;

forming a layer of a first material selected from the group consisting of titanium and titanium nitride in the trench;

filling the trench with aluminum or aluminum alloy to form a conductive plug;

planarizing the substrate;

patterning the substrate to partially expose the first material and to create a top portion and a bottom portion to the plug, wherein the bottom portion is in the substrate; and removing the first material from the top portion of the plug by plasma etching with a fluorine containing gas.

* * * * *